WITNESSES
Theodore T. Wadel
James F. Young

INVENTORS
Robert C. Miller
& Frederick M. Ryan
BY Ernest P. Klipfel
ATTORNEY

United States Patent Office 3,483,397

Patented Dec. 9, 1969

3,483,397

APPARATUS AND METHOD FOR CONTROLLING THE OUTPUT OF A LIGHT EMITTING SEMICONDUCTOR DEVICE

Robert C. Miller, Penn Hills, and Frederick M. Ryan, Franklin Township, Pa., assignors to Westinghouse Electric Corporation, Pittsburgh, Pa., a corporation of Pennsylvania Filed Oct. 16, 1963, Ser. No. 316,586

Int. Cl. H03k 3/42, 19/14, 23/12

U.S. Cl. 307—312 8 Claims

ABSTRACT OF THE DISCLOSURE

Apparatus and method for varying the threshold current level across the junction of a light emitting semiconductor device by applying a unidirectional force substantially perpendicular to the plane of the junction. The unidirectional force increases the intensity of the noncoherent output when operating below the threshold level.

The present invention relates generally to light emitting semiconductor devices and more particularly relates to apparatus and method for controlling the light output of a semiconductor junction device.

The advent of light emitting semiconductor junction devices has given rise to various apparatus and method for controlling the output light. Particular p-n junctions, for example, are capable of emitting light upon the application of current across their junctions in the forward direction. If the current density across the junction is less than the less threshold level of the device, non-coherent light is emitted from the junction plane edges. In accordance with known injection laser theory, coherent light output occurs when the current density exceeds the threshold level of the device.

The current density at which a mode or intensity spike, as a result of the onset of stimulated emission, begins to grow out of the narrowed spontaneous envelope of noncoherent light being omitted from a semiconductor junction device has been defined by those skilled in the art as the threshold current level. Prior to the current threshold level being exceeded only spontaneous emission or non-coherent light is emitted from the plane of the semiconductor junction. At least one predominant narrow stimulated emission line or mode occurs at current densities exceeding the threshold level. Other modes or peaks at other frequencies may also occur. It is desirable to increase the intensity of the non-coherent light output for a variety of purposes such as illumination for tape and card readers and various forms of signal and communication transmission systems. In some instances it is desirable to obtain coherent light output or lasering from a semiconductor junction device with as little current density across the junction as possible, so that the heat generated in the device may be dissipated without significantly raising the temperature of the device. By reducing the necessary current density the efficiency of optical power out over electrical power in can be increased. Further, upon attainment of coherent light it is desirable to vary the output frequency for the transmission of information. The present invention provides apparatus and method for accomplishing any of the foregoing features.

Various apparatus and methods have been suggested to accomplish one feature of the present invention, namely: varying the output frequency of a semiconductor injection laser device. Altering the composition of the material, changing the temperature, applying a magnetic field, and subjecting the junction to hydrostatic pressure have all been reported but none permit the construction of a simple, practical device. The IBM Journal, volume 7, p. 155 (1963) by Stevenson, Axe and Lankard describes apparatus for varying the frequency of coherent light output from a forward biased P-N gallium arsenide junction by immersing the device in a stainless steel pressure bomb equipped with a small quartz window. The hydrostatic pressure on the diode is varied to shift the frequency of the output modes that occur by stimulated emission. The application of pressure in all three directions to the semiconductor junction device results in complicated apparatus capable of varying the frequency of the output mode or modes but unable to reduce the threshold level for spontaneous emission of light or increase the intensity of non-coherent light prior to the attainment of the threshold level.

An object of the present invention is to provide method and apparatus for increasing the intensity of light output of a light emitting semiconductor junction device.

Another object of the present invention is to provide method and apparatus for altering the threshold level of a light emitting semiconductor device.

Another object of the present invention is to provide method and apparatus for varying the frequency of light output from a coherent light emitting semiconductor junction device.

A further object of the present invention is to provide apparatus of a simple practical construction for varying the frequency of coherent light output from a semiconductor injection laser.

Briefly, these and other objects are accomplished by providing a method and means for applying a unidirectional stress substantially perpendicular to the plane of the semiconductor junction.

Further objects and advantages of the present invention will be readily apparent from the following detailed description taken in conjunction with the drawing in which.

Figure 1:
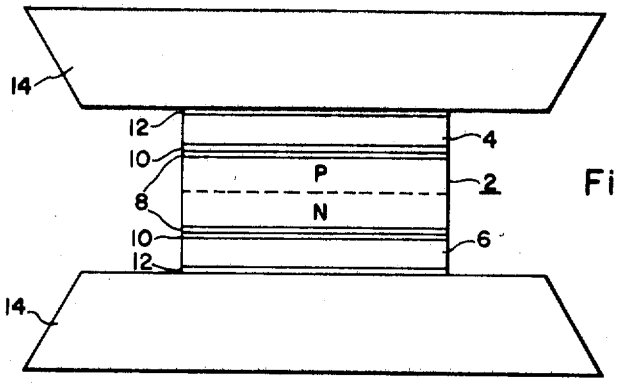
FIG. 1 is a sectional view of a semi-conductor assembly used in the present invention.
Figure 2:
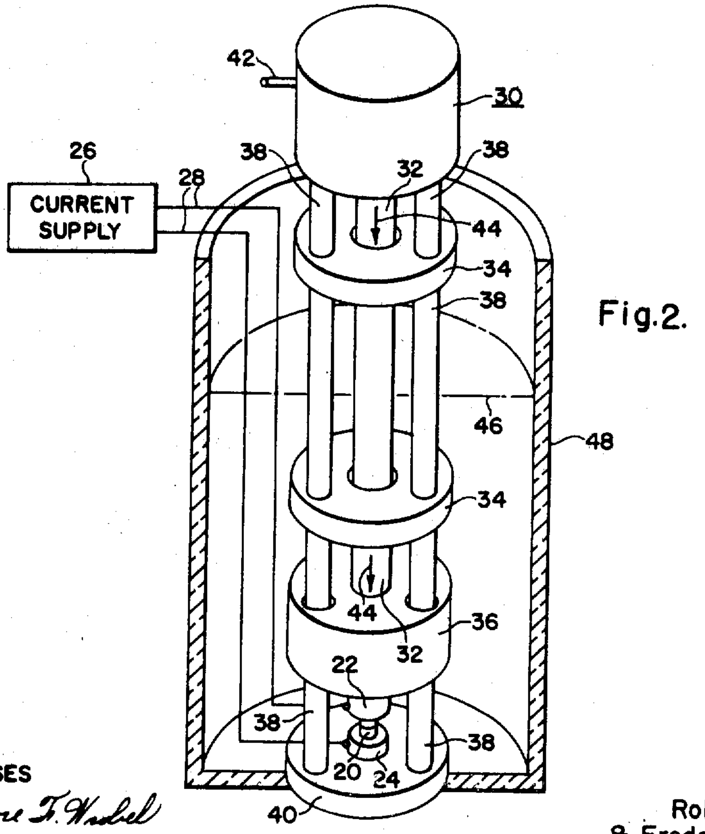
FIG. 2 is an illustrative embodiment of the present invention.

A semiconductor junction device of the type illustrated in FIG. 1 is utilized by the present invention. More particularly, a p–n junction located in a given plane was prepared by diffusing zinc in $10^{18}$ tellurium doped gallium arsenide. The gallium arsenide diode 2 was bonded between two Kovar plates 4 and 6 with a silver film 8 and tin film 10 providing electrical and thermal contact with the Kovar plates 4 and 6. Another layer of tin 12 connects the sandwich between beryllium copper anvils 14 to which large forces can be applied. The Kovar plates 4 and 6 are parallel to the (111) plane of the gallium arsenide diode 2. Two opposite exposed faces of the gallium arsenide diode 2 were optically polished flat and parallel and the remaining two faces had a rough laped finish. Such a structure is located in apparatus as shown in FIG. 2. Referring to FIG. 2, a semiconductor device 20 is placed between two anvils 22 and 24, of beryllium copper or other suitable material. A current supply 26 with electrical leads 28 is connected to pas a choen current density through the semiconductor device 20. The device 20 is chosen to be of a p-n structure such as gallium arsenide with the p-n junction located in a plane illustrated to be horizontally disposed to the anvils 22 and 24. An air piston assembly 30 is disposed to apply stress eclusively in a direction substantially perpendicular to the plane of the p-n junction. The assembly 30 includes a piston 32 extending through stationary positioning disc 24 to an insulator 36 of suitable material such as epoxy. Thrust rods 38 position the discs 34 and extend through the epoxy insulator 36 to a bottom disc 40. An air line 42 provides actuating means for the air piston assembly 30. Upon increase in the air pressure within the assembly the piston member 32 moves in a direction as indicated by the arrow 44 to apply a pressure per unit area or stress perpendicular to the plane of the p-n junction of the semiconductor device 20. The semiconductor device 20 is immersed in a refrigerating medium 46 such as liquid nitrogen or helium contained in a dewar jar 48 having transparent sides for the passage of light emitted from the semiconductor device 20.

With no pressure applied to the plane of the p-n junction and a current density less than the threshold level of the device non-coherent light will be emitted parallel to the plane of the junction. In order to increase the intensity of the non-coherent light output from the semiconductor device 20 stress is applied substantially perpendicular to the plane of the p-n junction by means of the piston assembly 30. For example, the output of a non-coherent diode has been increased approximately 30% by the application of 4000 atmospheres with a currentdensity of approximately 4 amperes/cm.$^2$ passing through the p-n junction.

Figure 3:
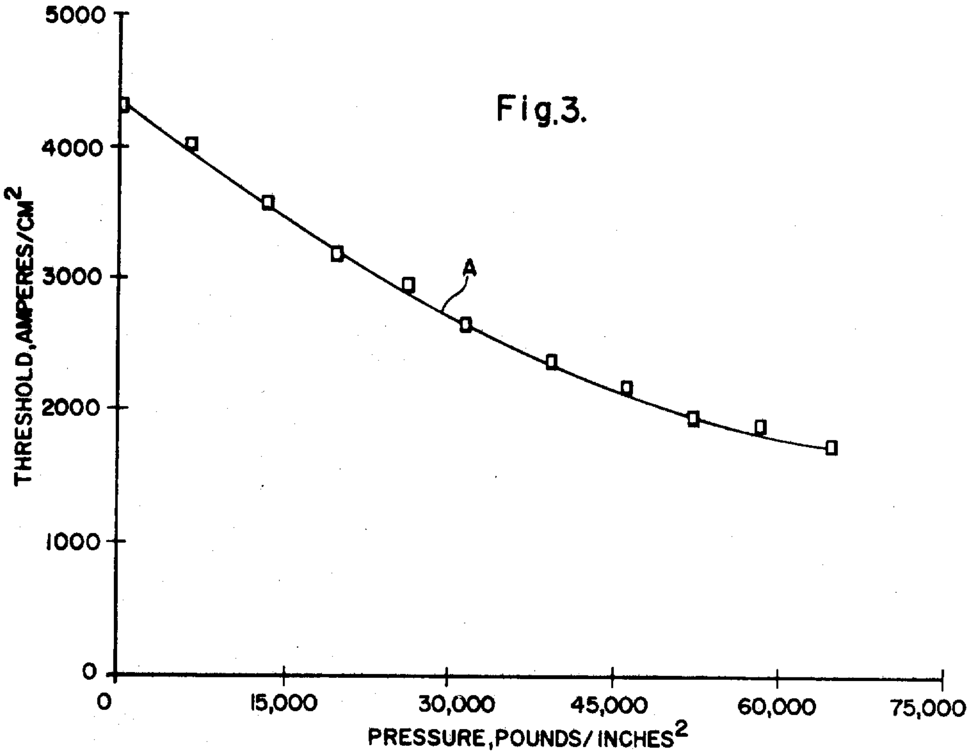
FIGS. 3, 4 and 5 are characteristic curves obtained when practicing the present invention.

Assuming now that instead of desiring to increase the intensity of non-coherent light output from the diode it is desired that lasering or coherent output be obtained from the junction. A stress can be applied to the p-n junction by means of the assembly 30 to reduce the threshold current level in comparison to the level when no pressure is so applied. It has ben observed that the threshold level of such a diode decreases as the pressure applied to the p-n junction is increased. A characteristic curve, A, of how the threshold varies with pressure applied to the p-n junction by a unidirectional force is illustrated in FIG. 3. A reduction in threshold of approximately 2½ that without pressure is observed.

When practicing the present invention a number of diodes with zero pressure thresholds in the range of 2000 to 8000 ampers/cm.$^2$ at 77° K. were used. These diodes were fabricated by various techniques, had different shapes such as square or rectangular, different sizes, and different locations of the light emitting junction. That is the junction was either centered between the Kovar plates or near to one of the plates. Some diodes had an area of 0.002 inches$^2$. While significant differences were observed between the individual diodes in general the threshold level at 5000 atmospheres (73,500 pounds/inch$^2$) was approximately one-fourth of that with no pressure. The largest change noted was in a diode that had a threshold of approximately 6000 amperes/cm.$^2$ with zero pressure which dropped to approximately 800 amperes per centimeter squared at 3000 atmospheres (44,000 pounds/inch$^2$) which was the maximum pressure applied to this particular diode. When the pressure was removed from the diodes they returned to their original threshold values with no measurable hysteresis. With semiconductor devices of the light emitting kind presently available an average maximum pressure of approximately 6500 atmospheres can be applied without fracturing the semiconductor device.

Figure 4:
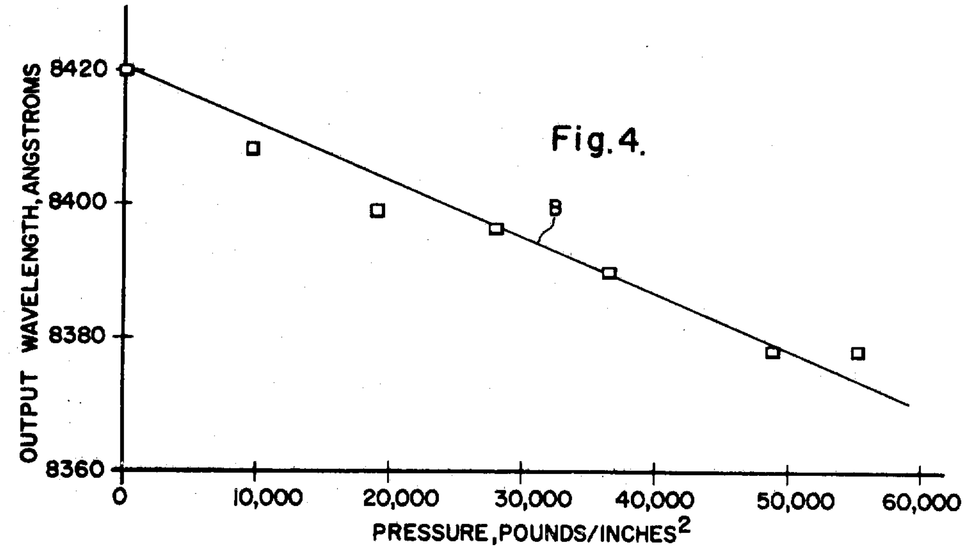
Figure 5:
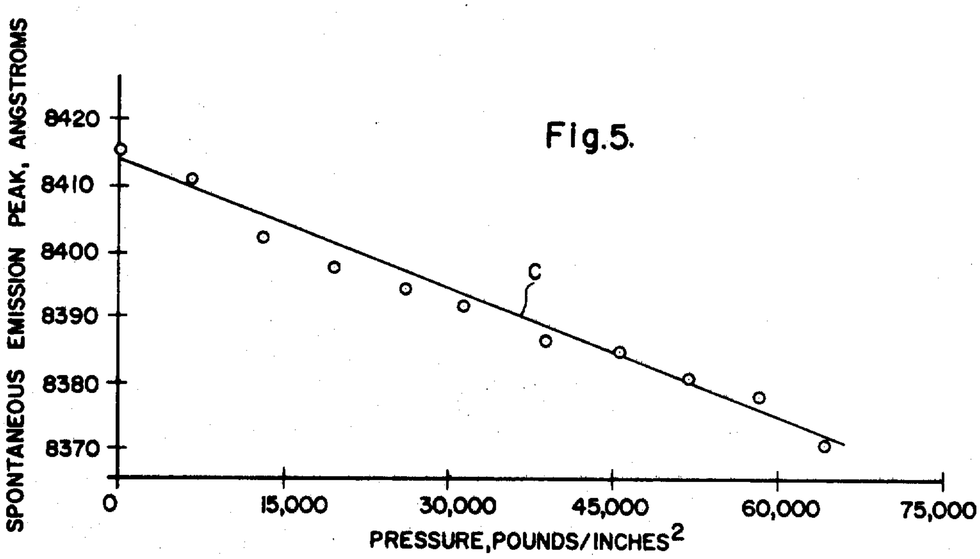

Upon exceeding the threshold level of the diode output modes or peaks of intensity resulting from stimulated emission are observed. The present invention provides for shifting the frequency of the output modes in a simple practical manner by applying force exclusively in one particular direction. A plot of stimulated or coherent output frequency observed from a semiconductor device at a current density just above the threshold level has been shown by the curve B in FIG. 4. The curve B is a generalization of the observable frequency of the coherent light output. The output frequency does not vary continuously with force but jumps from output mode to output mode in a step-like fashion. Some representative output wavelengths observed at various stresses have been plotted. The detailed plot of frequency versus force would consist of a number of steps rather than the smooth curve shown in the figure. However, by proper selection of the size and shape of the diode the steps may be made sufficiently small so as to permit essentially continuous tuning. The longer the distance between the two polished surfaces the closer the modes are spaced. Hence, an essentially variable frequency semiconductor injection laser is obtained by structure relatively simple to that of the prior art. The spontaneous emission also shifts with pressure as observed by the curve C in FIGURE 5. Representative frequency changes and pressures used for a current density of 4 amperes/cm.$^2$ are shown in FIG. 5.

A complete understanding of the theory of operation of the present invention is lacking but such data is not necessary to the successful practicing of the process of construction of the apparatus. Means for accomplishing the essential function has been illustrated. The means is indispensable to the accomplishment of the improved results recited.

The reduction in threshold current level can be explaned most simply by the assumption that the application of the unidirectional strain normal to the plane of the light emitting junction increases the probability of spontaneous emission of photons in a direction parallel to the plane of the junction and decreases the probability in the direction perpendicular to the junction. This is reasonable since the unidirectional strain destroys the cubic symmetry and would be expected to cause an anisotropic spacial distribution of the spontaneously emitted photons. In such an instance the threshold current is that current at which there are sufficient photons in a particular mode so that the gain in that mode equals the losses for that mode. In the presence of a strain more photons are emitted into the preferred modes and the threshold level will be lowered.

In a diode operated below threshold, only those photons which are emitted parallel to the junction have a high probability of emerging from the diode. Since it is assumed that the number of these preferred photons will increase with unidirectional strain, it is expected that an increase in the output of the diode would occur when strain is applied. It is suggested that the reduction in threshold level is not obtained with the application of hydrostatic pressure since the photons in the prior art case are emitted isotropically and no lowering of the threshold would be expected.

Figure 6:
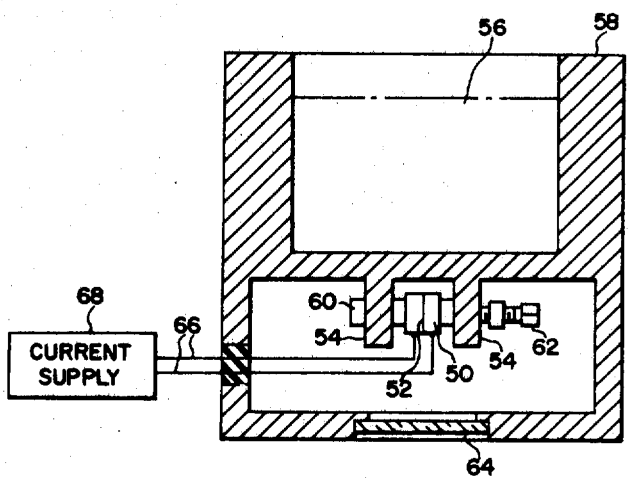
FIG. 6 is a schematic diagram of another illustrative embodiment of the present invention.

Another illustrative embodiment which shows the relative simplicity of the structure necessary to apply unidirectional force substantially perpendicular to the plane of the light emitting junction to thereby accomplish increased output light intensity, reduction in threshold level, or varying the output frequency of the coherent light is illustrated in FIG. 6. In that embodiment the semiconductor device is removed from the cooling medium so that the light emitted from the junction does not travel through the cooling liquid. The semiconductor device 50 including a suitable junction 52 such as a p-n junction is located in the plane illustrated. The device 50 is positioned between the anvils 54 which are in heat relationship with the cooling liquid 56 disposed in the container 58. Means for exclusively applying a force in a direction substantially perpendicular to the plane of the p-n junction is illustrated as a C-clamp 60 mounted over the anvils 54. A set screw mechanism 62 controls the amount of force per unit area directed to the p-n junction 52. A suitable window 64 in the housing 58 allows passage of light emitted from the junction. Electrical leads 66 provide connection of the semiconductor device 50 to a current supply 68 for the desired current density across the p-n junction 52.

It is obvious that various constructions can be utilized to practice the method put forth. When it is desirable to simply increase the intensity of non-coherent light such as for illumination then the semiconductor device may be encased in a suitable capsule to subject the light emitting junction to a force of predetermined magnitude in the desired direction. As explained previously, the intensity of light output is significantly increased.

While the present invention has been described with a degree of particularity for the purposes of illustration, it is to be understood that all alterations, modifications and equivalents within the spirit and scope of the present invention are herein meant to be included. For example, while a piston assembly and spring and screw arrangement have been illustrated to provide the unidirectional force it is to be understood that other combinations of springs, levers ,and weights could be used or a piezoelectric or magnetostrictive element might be employed to produce the force and allow the variance of such force. The present invention is not to be restricted to the application of constant forces. But is to include forces of a transient nature as well.

While a single semiconductor device for the emission of light has been illustrated it is to be understood that a plurality of such devices stacked upon each other or adjacent each other and each subjected to a current which is below the threshold in the absence of strain and above threshold for a given strain may be utilized. In this instance, coherent light output would be first emitted from that device initially subjected to the applied stress necessary to reduce its threshold level. Others would emit coherent light in turn as they are subjected to the necessary stress. Stimulated emission from an array of semiconductor devices can also be selectively controlled by varying the cross-sectional area of each device subjected to a given force.

The application of unidirectional force is equally applicable to any light emitting semiconductor device. Some devices may even experience an increase in threshold level with stress. In particular, the present invention has application to other light emitting junctions prepared from the so-called Group II–V compounds.

We claim as our invention:

1. In combination, a semiconductor device including a current responsive light emitting junction located in a given plane and having a threshold current level below which non-coherent light is emitted therefrom, means for passing a current through said junction of sufficient magnitude to cause the emission of non-coherent light but of insufficient magnitude to allow coherent emission, and means for mounting said junction in a condition strained in a direction perpendicular to the plane of the junction to increase the intensity of light output emitted.

2. In an injection laser; a semiconductor device having a current responsive-light emitting junction in a given plane and having a current threshold level which when exceeded emits coherent light from the junction-plane edges of said junction; means for passing current through said junction; and current threshold level varying means for applying pressure exclusively in a direction substantially perpendicular to the plane of said light emitting junction to alter the current threshold level of said device.

3. A method of increasing the magnitude of intensity of noncoherent light output from a semiconductor light emitting junction located in a given plane comprising the steps of passing a current through said junction to cause noncoherent light emission therefrom; and applying a stress to the junction exclusively in a direction normal to the plane of the junction.

4. A method of obtaining coherent light output from an injection laser comprising; passing current through the light emitting junction of insufficient density to make the light emission from said junction coherent in the absence of strain; and applying pressure exclusively in a direction substantially normal to the plane of the light emitting junction to reduce the threshold level of said junction for coherent emission.

5. In combination, a semiconductor device including a current responsive light-emitting junction located in a given plane and having a threshold current level below which noncoherent light is emitted from the junction-plane edges and above which coherent light is emitted from the junction-plane edges, means for passing current through said junction, and threshold varying means for applying a unidirectional strain substantially perpendicular to the plane of the junction to alter the magnitude of the threshold current level.

6. In combination, an injection diode including a current responsive light emitting junction located in a given plane and having a threshold current level which when exceeded lases from the junction-plane edges, means for passing current through said junction, and means for mounting said junction in a condition strained in a direction perpendicular to the plane of the junction to reduce the threshold current level to cause the diode to lase.

7. In combination, a plurality of semiconductor devices each having a current responsive light emitting junction, means for passing a current through each device which is less than a predetermined current threshold for coherent light emission from its junction, and threshold varying means for applying a unidirectional force substantially perpendicular to the plane of each said junction whereby coherent light emission will occur.

8. The combination of claim 6 wherein said plurality of semiconductor devices are stacked adjacent each other.

References Cited

UNITED STATES PATENTS

| | | | |
|---|---|---|---|
| 3,245,002 | 4/1966 | Hall | 331—94.5 |
| 3,387,230 | 6/1968 | Marinace | 332—7.51 |
| 3,145,548 | 8/1964 | Hutson. | |
| 3,183,359 | 5/1965 | White. | |

OTHER REFERENCES

Fenner et al.: "Coherent Light Emission From Gas Junctions," Physical Review Letters: November 1962, vol. 8, No. 9, pp. 366–368.

Stevenson et al.: "Line Widths and Pressure Shifts in Mode Structure of Stimulated Emission GaAs Junctions," IBM Journal, April 1963, pp. 155–156.

ALFRED L. BRODY, Primary Examiner

U.S. Cl. X.R.

259—199; 331—94.5; 332—7.51